(12) United States Patent
Xu

(10) Patent No.: US 11,456,587 B2
(45) Date of Patent: Sep. 27, 2022

(54) TELESCOPIC POWER SUPPLY TRACK

(71) Applicants: Self Electronics Co., Ltd., Zhejiang (CN); Wanjiong Lin, Zhejiang (CN); Self electronics USA Corporation, Norcross, GA (US)

(72) Inventor: Le Xu, Zhejiang (CN)

(73) Assignee: Self Electronics Co., Ltd., Ningbo (CN)

( * ) Notice: Subject to any disclaimer, the term of this patent is extended or adjusted under 35 U.S.C. 154(b) by 437 days.

(21) Appl. No.: 16/835,143

(22) Filed: Mar. 30, 2020

(65) Prior Publication Data

US 2021/0036499 A1  Feb. 4, 2021

(30) Foreign Application Priority Data

Jul. 30, 2019 (CN) .......................... 201910696178.7

(51) Int. Cl.
  *H02G 11/00* (2006.01)
  *H01B 7/06* (2006.01)
  *H02G 5/04* (2006.01)

(52) U.S. Cl.
  CPC ............. *H02G 11/006* (2013.01); *H01B 7/06* (2013.01); *H02G 5/04* (2013.01)

(58) Field of Classification Search
  CPC ........... H02G 11/006; H02G 5/04; H01B 7/06
  See application file for complete search history.

(56) References Cited

U.S. PATENT DOCUMENTS

| 6,358,070 B1 * | 3/2002 | Lin ...................... H01R 25/145 439/115 |
| 2014/0293516 A1 * | 10/2014 | Swift ....................... H02B 1/04 248/65 |
| 2015/0079823 A1 * | 3/2015 | Lindblom .......... H01R 13/5825 439/110 |

* cited by examiner

*Primary Examiner* — Pete T Lee
(74) *Attorney, Agent, or Firm* — Wang Law Firm, Inc.

(57) ABSTRACT

A telescopic power supply track has a strip-shaped power supply base and a power taking module, the power taking module has a rod-shaped housing, a second external terminal, and two electrical contacts provided on the rod-shaped housing away from the second external terminal and are respectively set against the two conductive strips to position and electrically connect the power taking module; and two strip-shaped conductive members, arranged in the hollow structure of the rod-shaped housing, and the two ends of the strip-shaped conductive member are respectively electrically connected to the second external terminal and the two electrical contacts. The invention solves the problem of the long lead in the shelf in the prior art and the need to reserve the lead, reduces the time of the short line, increases beauty and improves safety.

10 Claims, 8 Drawing Sheets

TELESCOPIC POWER SUPPLY TRACK

RELATED APPLICATION

This application claims priority to a Chinese Patent Application No. CN 201910696178.7, filed on Jul. 30, 2019.

FIELD OF THE TECHNOLOGY

The present invention relates to the field of shelf power supply, with particular emphasis on a telescopic power supply track.

BACKGROUND OF THE INVENTION

When installing shelves in supermarkets, shopping malls and other occasions, the power supply wires need to be led out from the back of the shelf and routed along the side brackets under the shelves and then connected to the lights. In the prior art, the power wires are mainly fixed on the laminate bracket by the wire buckle with magnet. However, in actual use, the width of the shelf layer is often adjusted, which causes the installation position of the luminaries to change accordingly, so that the length of the wire must be adjusted to meet the requirements of the installation position of the luminaries, which needs to adjust or reserve a certain amount of wires, so you need to adjust or not only increase the time for cable management, but the power supply conductors of the existing design are exposed, which is not only unsightly but also has hidden safety hazards.

In order to overcome the above problems, some researchers have proposed some rail-type power supply systems that provide power by providing a rail and a power take-off head, but the length of the rails in the above structure is not variable and cannot be applied.

BRIEF SUMMARY OF THE INVENTION

In view of this, the present invention provides a telescopic power supply track to solve the above technical problems.

A telescopic power supply track, comprising:

a strip-shaped power supply base, provided with two conductive strips extending in the length direction, and one end is provided with a first external terminal electrically connected to the two conductive strips;

a power taking module, which slides in the length direction and is limited in the strip-shaped power supply base in the radial direction;

the power taking module, comprising:

a rod-shaped housing, provided with a hollow structure;

a second external terminal, provided on an end of the rod-shaped housing away from the first external terminal;

two electrical contacts, provided on the rod-shaped housing away from the second external terminal and are respectively set against the two conductive strips to realize the positioning and electrical connection of the power taking module;

and two strip-shaped conductive members, arranged in the hollow structure of the rod-shaped housing, and the two ends of the strip-shaped conductive member are respectively electrically connected to the second external terminal and the two electrical contacts.

advantageously, the cross-section of the strip-shaped power supply base is a U-shaped groove.

advantageously, two sides of strip power supply base are snap-fitted with the rod-shaped housing.

advantageously, the conductive strips are disposed on the bottom surface of the strip-shaped power supply base.

advantageously, the electrical contact is an elastic piece structure.

advantageously, an end of the rod-shaped housing is provided with an end cover (205) that encapsulates the hollow structure.

advantageously, the elastic piece structure, comprising a fixed connection portion, disposed in the end cover, and one end is electrically connected with the strip-shaped conductive member;

and an elastic bending portion, formed by extending the other end of the fixed connection portion toward the strip-shaped power supply base.

advantageously, the conductive strip and the strip-shaped conductive member are made of a ferromagnetic substance, and the electrical contact is a magnet and is fixed to the strip-shaped conductive member in the length direction.

advantageously, the rod-shaped housing is provided with two hollow structures side by side and the two strip-shaped conductive members pass through one of the hollow structures, respectively.

advantageously, one side of the rod-shaped housing facing the strip-shaped power supply base is provided with two mounting grooves that communicate with the hollow structure, and the strip-shaped conductive member serves as the bottom surface of the mounting groove; one side of the electrical contact is attracted in the mounting groove, and the other side is attracted to the corresponding conductive strip.

Technical effects of the invention:

The telescopic power supply track of the invention has a simple structure and is convenient for installation and manufacture, and solves the problems of excessively long wire lengths in the prior art and the need to reserve wire lengths in the prior art. It also reduces the time for wire management, reduces bare wires, and increases aesthetics, and improves security.

BRIEF DESCRIPTION OF THE DRAWINGS

The following describes embodiments of the present invention with reference to the accompanying drawings, in which.

DETAILED DESCRIPTION OF THE INVENTION

Hereinafter, specific embodiments of the present invention will be described in further detail based on the drawings. It should be understood that the description of the embodiments of the present invention is not intended to limit the protection scope of the present invention.

Embodiment 1

Figure 1:
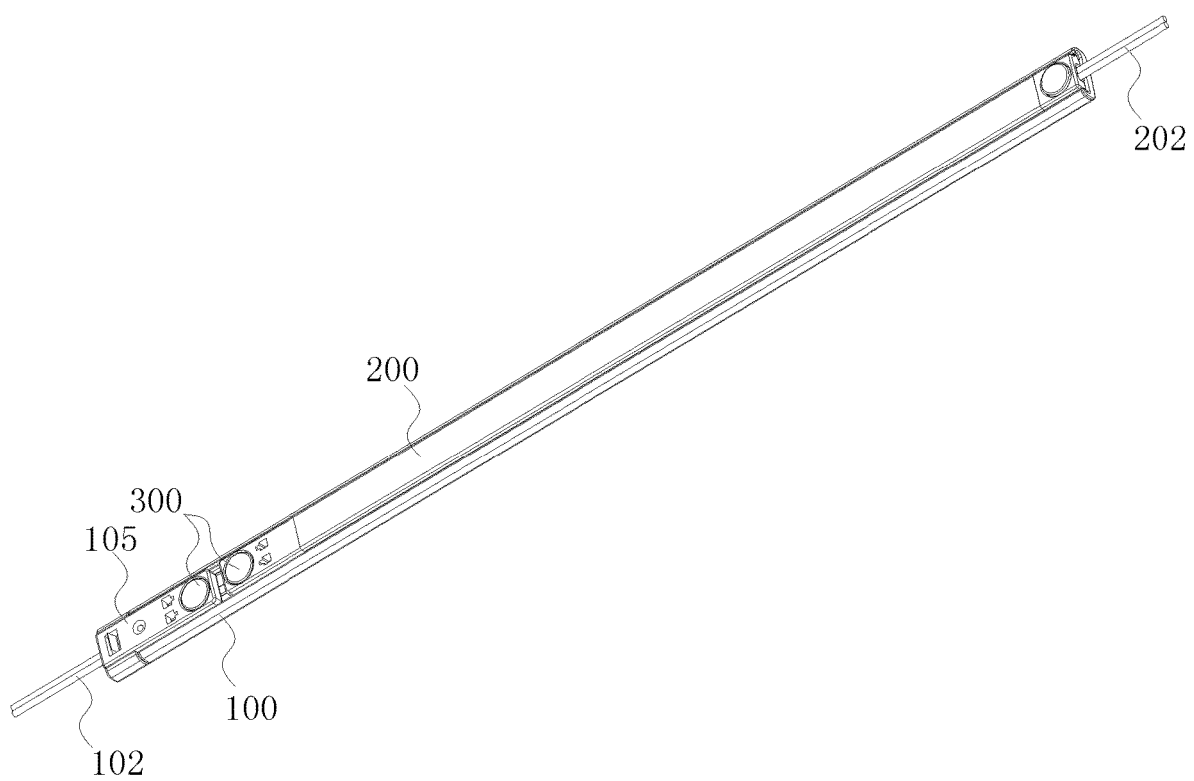
FIG. 1 is a schematic structural diagram of a telescopic power supply track of embodiment 1.
Figure 2:
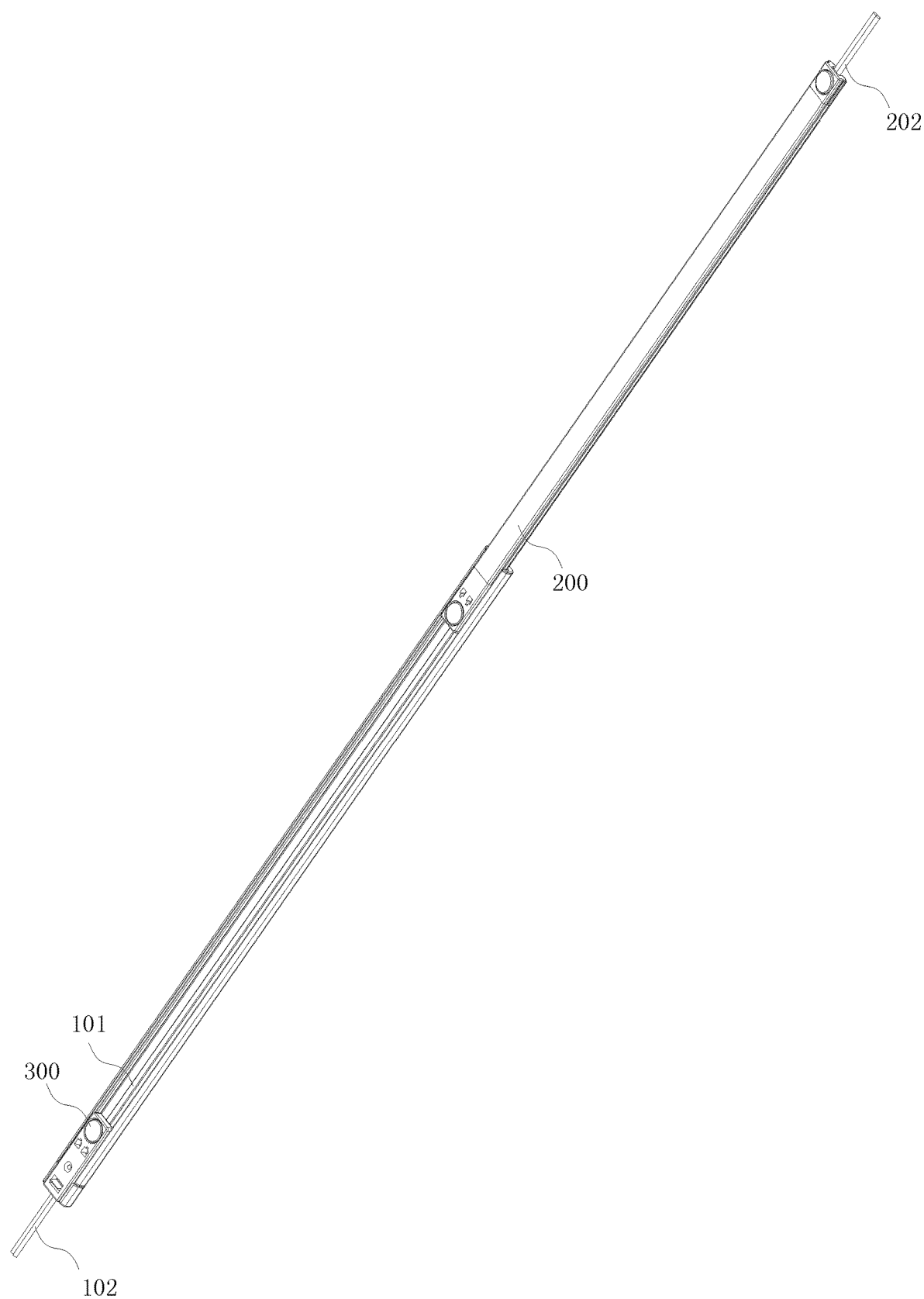
FIG. 2 is a schematic structural diagram of a telescopic power supply track (after being stretched) of embodiment 1.
Figure 3:
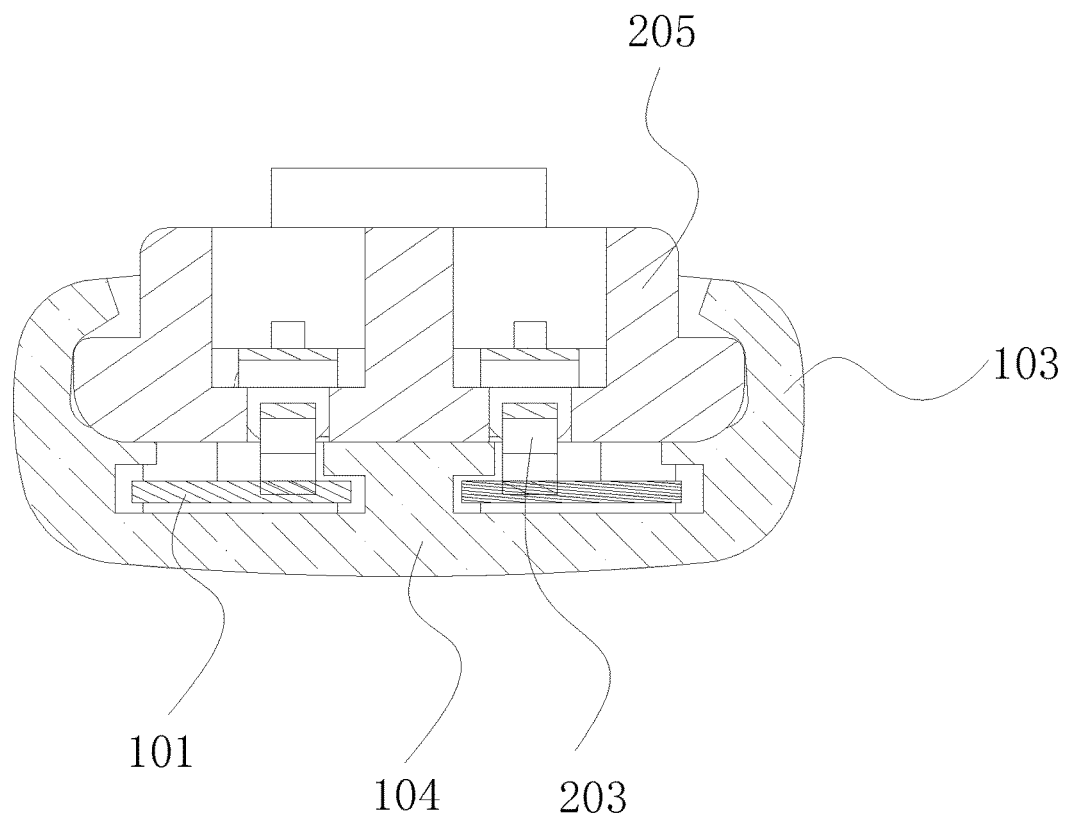
FIG. 3 is a schematic cross-sectional view of a cross section of a telescopic power supply track of embodiment 1.
Figure 4:
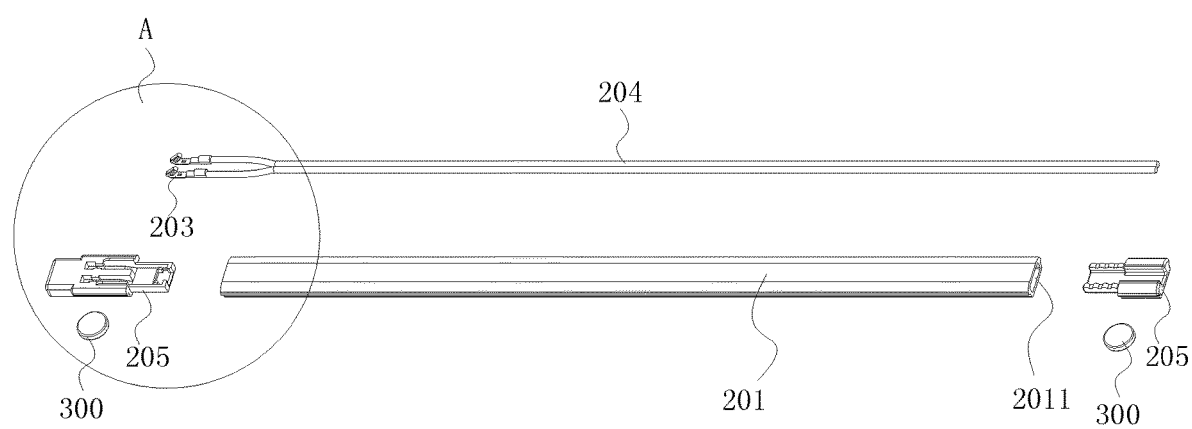
FIG. 4 is an exploded schematic diagram of a power taking module of the telescopic power supply track of embodiment 1.
Figure 5:
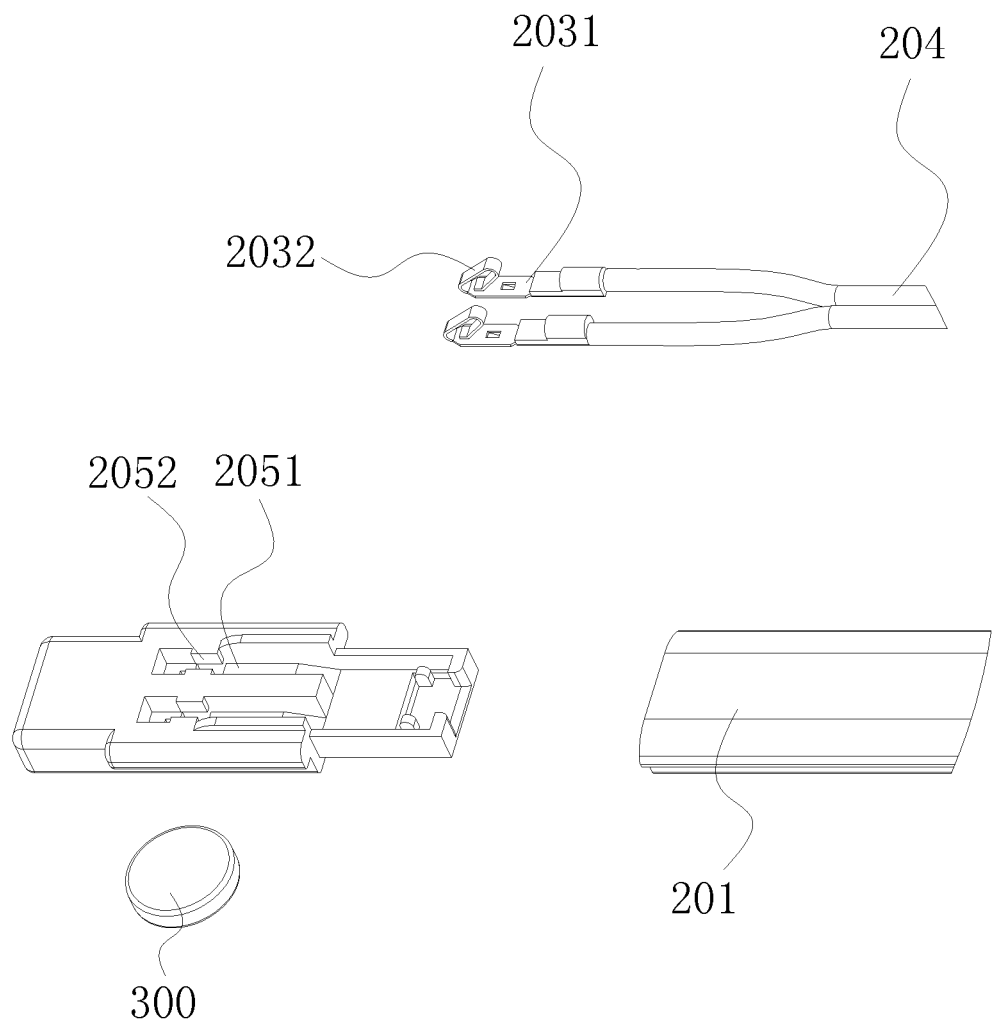
FIG. 5 is an enlarged schematic view of part A in FIG. 4.

As shown in FIG. 1 to 5, the telescopic power supply track of this embodiment includes a strip-shaped power supply base 100 and a power taking module 200. The strip-shaped power supply base 100 is provided with two conductive strips 101 extending in the length direction. One end of the strip-shaped power supply base 100 is provided with a first external terminal 102 electrically connected to the two conductive strips 101; the first external terminal 102 is used for external power supply or other power supply guides, or is a plug-in connector or a power-taking module. End caps 105 are provided at both ends of the strip-shaped power supply base 100, one of which is used to connect the first external terminal 102 and the other is used to prevent the power taking module 200 from coming out.

The above-mentioned electrical connection can be realized by welding, abutting, or the like. The strip-shaped power supply base 100 and the power taking module 200 are further provided with a magnet 300 for fixing.

The power taking module 200 slides in the length direction and is limited in the strip-shaped power supply base 100 in the radial direction, so as to realize taking power and supplying power to the lamp. In the prior art, the power-taking head is generally connected to the external terminal directly, and the terminal is connected to the lamp to realize power supply. In order to meet the power supply installation requirements of the layer boards of different depths, in this embodiment, the power taking module 200 includes a rod-shaped housing 201, a second external terminal 202, two electrical contacts 203, and two strip-shaped conductive members 204.

The rod-shaped housing 201 is provided with a hollow structure 2011. The second external terminal 202 is provided on an end of the rod-shaped housing 201 away from the first external terminal 102. Two electrical contacts 203 are provided on the rod-shaped housing 201 away from the second external terminal 202 and are respectively set against the two conductive strips 101 to realize the positioning and electrical connection of the power taking module 200; two strip-shaped conductive members 204 are arranged in the hollow structure of the rod-shaped housing 201, and the two ends of the strip-shaped conductive member 204 are electrically connected to the second external terminal 202 and the two electrical contacts 203. The rod-shaped housing 201 plays a role of protecting the strip-shaped conductive members 204.

The above structure obtains a telescopic power supply track. The first external terminal 102 and the second external terminal 202 are distributed at both ends of the telescopic power supply track. The length can be adjusted according to the size requirements of the layer board or other installation equipment. The external wiring of first external terminal 102 and the second external terminal 202 can be set very short, thereby avoiding that the length of the wire also has to be adjusted according to the installation position of the lamp. It is no longer necessary to reserve a certain wire, so as to shorten the time for wire management, reduce bare wires, increase aesthetics, and also improve safety.

In order to facilitate installation and removal, the cross section of the strip-shaped power supply base 100 in this embodiment is a U-shaped groove. Two sides 103 of strip power supply base 100 are snap-fitted with the rod-shaped housing 201 to achieve radial limit, which is simple in structure and easy to disassemble.

The conductive strips 101 can be disposed inside or outside the strip-shaped power supply base 100. In order to achieve good electrical contact, in this embodiment, the conductive strips 101 are disposed on the bottom surface 104 of the strip-shaped power supply base 100.

There are many forms of the electrical contact 203. In order to facilitate manufacturing and installation and ensure good electrical contact, in this embodiment, the electrical contact 203 uses an elastic piece structure, and there are many specific installation methods and structures, such as elastic sheets, elastic pins, and elastic beads or the like. Specifically, in this embodiment, an end of the rod-shaped housing 201 is provided with an end cover 205 that encapsulates the hollow structure, and the elastic piece structure includes a fixed connection portion 2031 and an elastic bending portion 2032. The fixed connection portion 2031 is disposed in the end cover 205, and one end is electrically connected to the strip-shaped conductive member 204. In this embodiment, the strip-shaped conductive member 204 is in the form of a wire, and the elastic bending portion 2032 is formed by extending the other end of the fixed connection portion 2031 towards the strip-shaped power supply base 100.

Specifically, a strip-shaped clamping slot 2051 is provided in the end cover 205, and the fixed connection portion 2031 is a strip-shaped conductive piece, which passes through the clamping slot 2051, and the clamping slot 2051 is provided with a necked section 2052 for positioning the fixed connection portion 2031. The elastic bending portion 2032 is formed by bending the other end of the fixed connection portion 2031 downwardly and then folding back to the fixed connection portion 2031 in the direction of the strip-shaped conductive member 204 again, and the end thereof abuts against the fixed connection portion 2031.

Since the power taking module 200 is limited on the strip-shaped power supply base 100 in the radial direction, the elastic bending portion 2032 is damped after being compressed, and plays a role of positioning.

Embodiment 2

Figure 6:
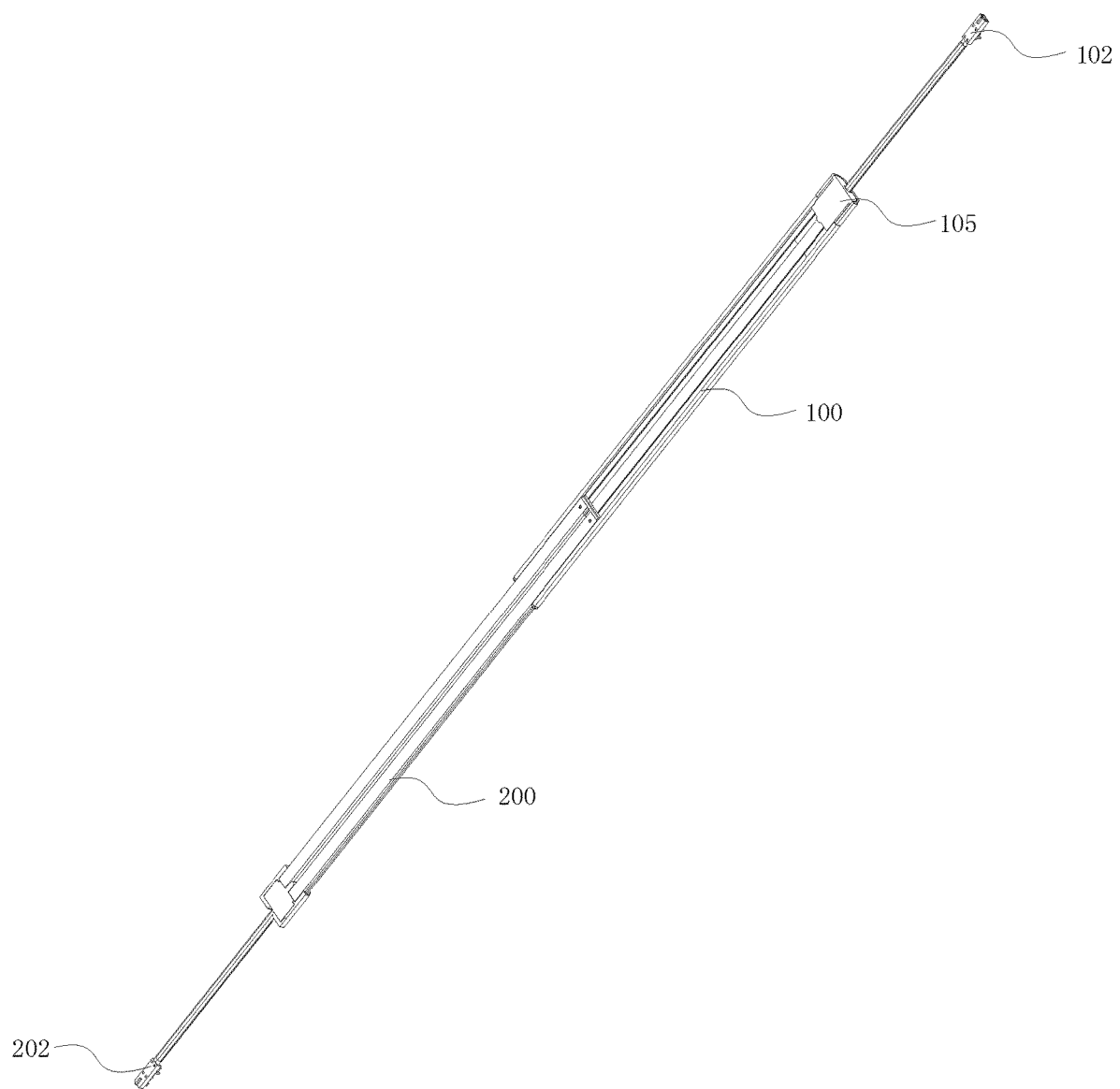
FIG. 6 is a schematic structural diagram of a telescopic power supply track of embodiment 2.
Figure 7:
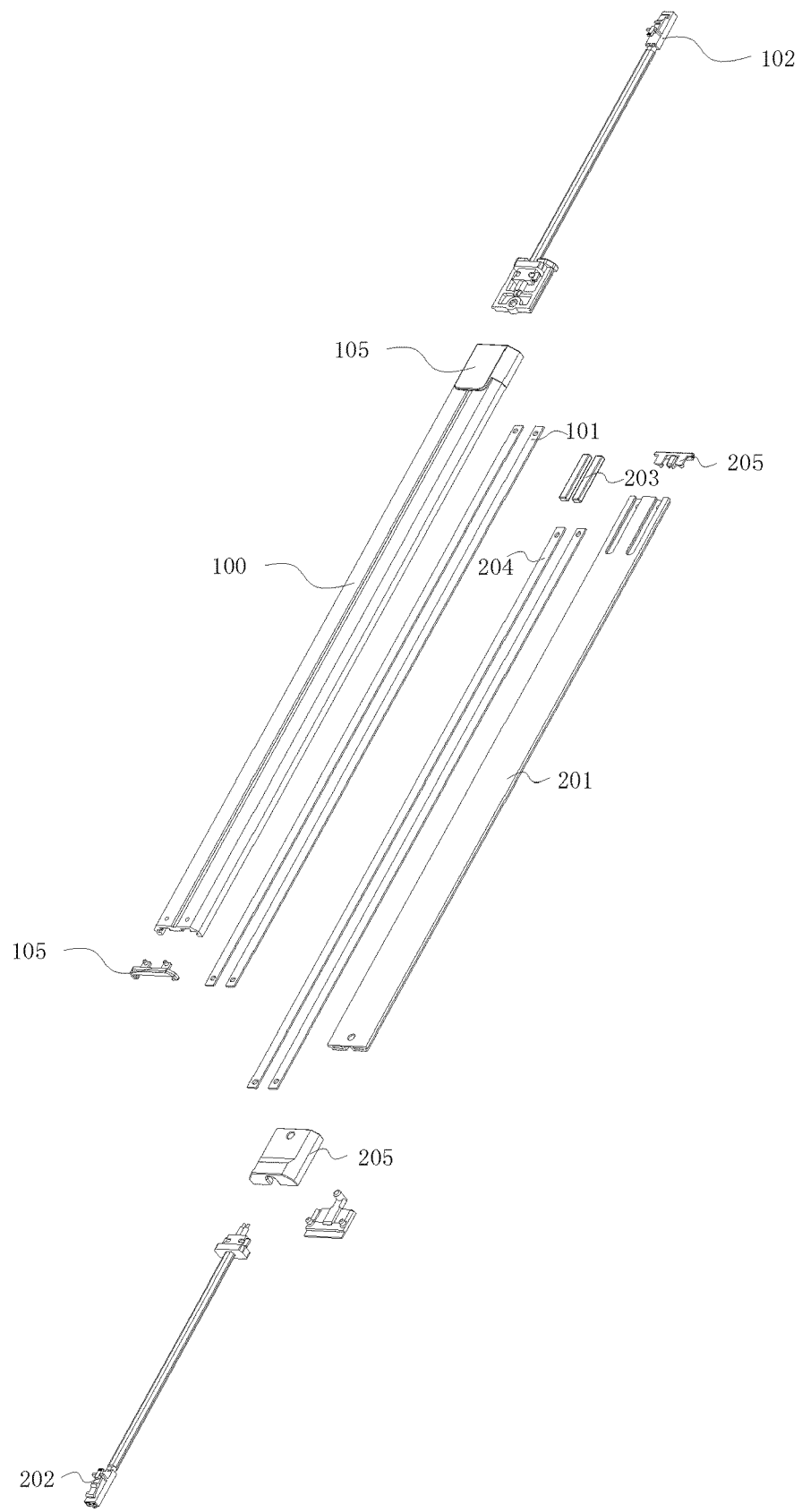
FIG. 7 is an exploded schematic view of a telescopic power supply track of embodiment 2.
Figure 8:
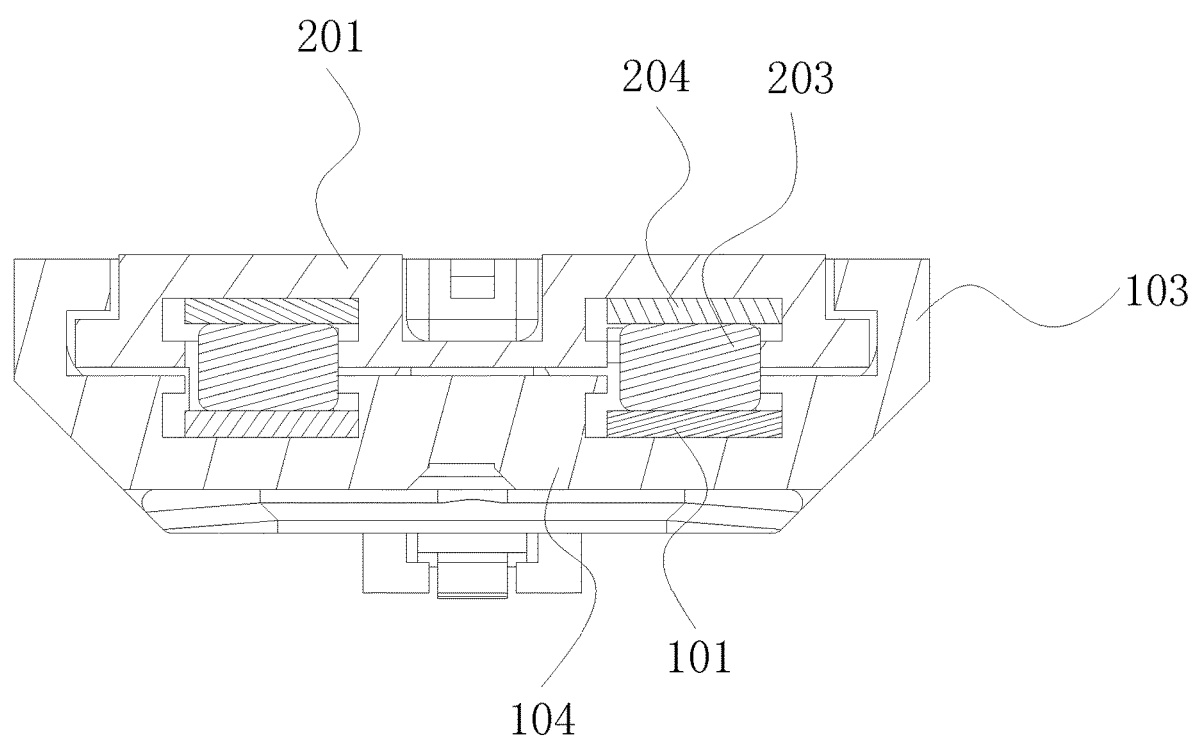
FIG. 8 is a schematic cross-sectional view of a cross section of a telescopic power supply track of embodiment 2.
Figure 9:
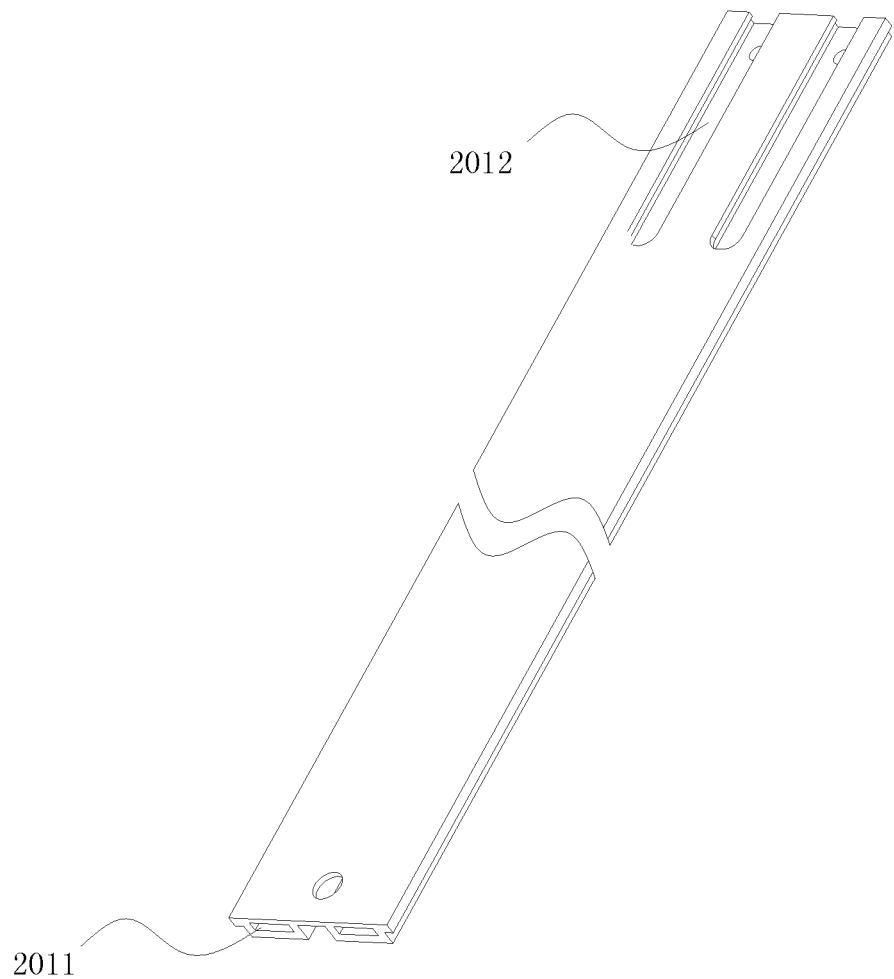
FIG. 9 is a schematic structural diagram of a rod-shaped housing 201 of a telescopic power supply track of embodiment 2.

As shown in FIGS. 6 to 9, in this embodiment, the structure is the same as that of embodiment 1 except for the power taking module 200. In this embodiment, the conductive strip 101 and the strip-shaped conductive member 204 are made of ferromagnetic material. Iron-based conduction is used, and the electrical contact 203 is a magnet and is fixed to the strip-shaped conductive member 204 in the length direction.

In order to reduce the interference between the two strip-shaped conductive members 204, the rod-shaped housing 201 is provided with two hollow structures 2011 side by side, and the two strip-shaped conductive members 204 pass through one of the hollow structures 2011, respectively. The side of the rod-shaped housing 201 facing the strip-shaped power supply base 100 is provided with two mounting grooves 2012 that communicate with the hollow structure 2011. The strip-shaped conductive member 204 serves as the bottom surface of the mounting groove 2012. One side of the electrical contact 203 is attracted in the mounting groove 2012, and the other side is attracted on the corresponding conductive strip 101. The electrical contact 203 has a rectangular structure, part of which is embedded in the mounting groove 2012, and the other part slides on the conductive strip 101.

In the above structure, the electrical contact 203 is fixed in the mounting groove 2012 or installed in a movable manner.

The above disclosure has been described by way of example and in terms of exemplary embodiment, and it is to be understood that the disclosure is not limited thereto. Rather, any modifications, equivalent alternatives or improvement etc. within the spirit of the invention are encompassed within the scope of the invention as set forth in the appended claims.

What is claimed is:

1. A telescopic power supply track, comprising:
   a strip-shaped power supply base (100), provided with two conductive strips (101) extending in the length direction, and one end is provided with a first external terminal (102) electrically connected to the two conductive strips (101);
   a power taking module (200), which slides in the length direction and is limited in the strip-shaped power supply base (100) in the radial direction;
   characterized in that,
   the power taking module (200), comprising:
   a rod-shaped housing (201), provided with a hollow structure (2011);
   a second external terminal (202), provided on an end of the rod-shaped housing (201) away from the first external terminal (102);
   two electrical contacts (203), provided on the rod-shaped housing (201) away from the second external terminal (202) and are respectively set against the two conductive strips (101) to realize the positioning and electrical connection of the power taking module (200);
   and two strip-shaped conductive members (204), arranged in the hollow structure of the rod-shaped housing (201), and the two ends of the strip-shaped conductive member (204) are respectively electrically connected to the second external terminal (202) and the two electrical contacts (203).

2. The telescopic power supply track as claimed in claim 1, wherein the cross-section of the strip-shaped power supply base (100) is a U-shaped groove.

3. The telescopic power supply track as claimed in claim 2, wherein two sides (103) of strip power supply base (100) are snap-fitted with the rod-shaped housing (201).

4. The telescopic power supply track as claimed in claim 1, wherein the conductive strips (101) are disposed on the bottom surface (104) of the strip-shaped power supply base (100).

5. The telescopic power supply track as claimed in claim 1, wherein the electrical contact (203) is an elastic piece structure.

6. The telescopic power supply track as claimed in claim 1, wherein an end of the rod-shaped housing (201) is provided with an end cover (205) that encapsulates the hollow structure.

7. The telescopic power supply track as claimed in claim 6, wherein the elastic piece structure, comprising
   a fixed connection portion (2031), disposed in the end cover (205), and one end is electrically connected with the strip-shaped conductive member (204);
   and an elastic bending portion (2032),formed by extending the other end of the fixed connection portion (2031) toward the strip-shaped power supply base (100).

8. The telescopic power supply track as claimed in claim 1, wherein the conductive strip (101) and the strip-shaped conductive member (204) are made of a ferromagnetic substance, and the electrical contact (203) is a magnet and is fixed to the strip-shaped conductive member (204) in the length direction.

9. The telescopic power supply track as claimed in claim 8, wherein the rod-shaped housing (201) is provided with two hollow structures (2011) side by side, and the two strip-shaped conductive members (204) pass through one of the hollow structures (2011), respectively.

10. The telescopic power supply track as claimed in claim 9, wherein one side of the rod-shaped housing (201) facing the strip-shaped power supply base (100) is provided with two mounting grooves (2012) that communicate with the hollow structure (2011), and the strip-shaped conductive member (204) serves as the bottom surface of the mounting groove (2012); one side of the electrical contact (203) is attracted in the mounting groove (2012), and the other side is attracted to the corresponding conductive strip (101).

\* \* \* \* \*